United States Patent
Kopperger et al.

(10) Patent No.: US 7,955,712 B2
(45) Date of Patent: Jun. 7, 2011

(54) SEMIFINISHED PRODUCT MADE OF A COMPOSITE MATERIAL AND METHOD FOR PRODUCING A SEMIFINISHED PRODUCT FROM A COMPOSITE MATERIAL

(75) Inventors: Bertram Kopperger, Dachau (DE); Axel Rossmann, Karlsfeld (DE); Alexander Sagel, Lenningen (DE)

(73) Assignee: MTU Aero Engines GmbH, Munich (DE)

( * ) Notice: Subject to any disclaimer, the term of this patent is extended or adjusted under 35 U.S.C. 154(b) by 986 days.

(21) Appl. No.: 10/585,804

(22) PCT Filed: Dec. 22, 2004

(86) PCT No.: PCT/DE2004/002797
§ 371 (c)(1),
(2), (4) Date: Aug. 2, 2006

(87) PCT Pub. No.: WO2005/066382
PCT Pub. Date: Jul. 21, 2005

(65) Prior Publication Data
US 2008/0233419 A1   Sep. 25, 2008

(30) Foreign Application Priority Data
Jan. 12, 2004   (DE) .......................... 10 2004 001 644

(51) Int. Cl.
C22C 32/00 (2006.01)
B32B 15/04 (2006.01)
D04H 1/00 (2006.01)

(52) U.S. Cl. ............. 428/539.5; 428/292.1; 428/293.1

(58) Field of Classification Search ............. 428/292.1, 428/293.1
See application file for complete search history.

(56) References Cited

U.S. PATENT DOCUMENTS

| | | |
|---|---|---|
| 4,915,908 A | 4/1990 | Nagle et al. |
| 5,371,050 A * | 12/1994 | Belitskus et al. ............ 501/95.2 |
| 5,400,505 A | 3/1995 | Wei et al. |
| 5,413,851 A * | 5/1995 | Storer .......................... 428/361 |
| 5,426,000 A * | 6/1995 | Labib et al. .................. 428/547 |
| 5,876,659 A | 3/1999 | Yasutomi et al. |
| 5,955,391 A * | 9/1999 | Kameda et al. ................. 501/88 |
| 2005/0214533 A1* | 9/2005 | Shimosaki et al. ........... 428/375 |
| 2006/0021728 A1* | 2/2006 | Gadow et al. ................... 164/80 |

FOREIGN PATENT DOCUMENTS
| | | |
|---|---|---|
| DE | 43 24 755 | 9/1994 |
| JP | 03-002338 | 1/1991 |

* cited by examiner

*Primary Examiner* — D. Lawrence Tarazano
*Assistant Examiner* — Camie S Thompson
(74) *Attorney, Agent, or Firm* — W. F. Fasse; W. G. Fasse

(57) ABSTRACT

A semifinished product of composite material consists of a metallic matrix material and high tensile strength fibers embedded in the matrix material, whereby the metallic matrix material is formed of titanium or a titanium based alloy. Ceramic particles are encased or embedded in the matrix material for increasing the strength of the semifinished product with respect to torsional loading or transverse loading. The product is produced by a method in which the fibers are coated with the matrix material, ceramic particles are embedded in the matrix material coating the fibers, and then the thusly coated fibers are arranged in a desired geometry and are consolidated to form the product.

16 Claims, 2 Drawing Sheets

SEMIFINISHED PRODUCT MADE OF A COMPOSITE MATERIAL AND METHOD FOR PRODUCING A SEMIFINISHED PRODUCT FROM A COMPOSITE MATERIAL

FIELD OF THE INVENTION

The invention relates to a semifinished product of composite material and to a method for the production of a semifinished product of composite material.

BACKGROUND INFORMATION

Modern gas turbines, especially aircraft engines, must satisfy the highest demands with respect to reliability, weight, power, economy, and operating service life. In the last decades, aircraft engines were developed especially in the civil sector, which fully satisfy the above demands and have achieved a high degree of technical perfection. In the development of aircraft engines, among other things, the material selection as well as the search for new suitable materials play a decisive role.

The most important materials used these days for aircraft engines or other gas turbines are titanium alloys, nickel alloys (also called super alloys) and high strength steels. The high strength steels are used especially for shaft parts and transmission parts and for compressor housings as well as turbine housings. Titanium alloys are typical materials for compressor parts, nickel alloys are suitable for the hot parts of the aircraft engine.

A very promising group of a new material for future generations of aircraft engines are so-called fiber reinforced composite materials. Modern composite materials include a carrier material, which can be embodied as a polymer matrix, a metal matrix, or a ceramic matrix, as well as fibers embedded in the carrier material. The present invention relates to a composite material in which the carrier material is embodied as a metal matrix. Such a material is also designated as a metal matrix composite, which is called MMC for short.

In connection with high strength MMC materials, in which titanium is utilized as a carrier material, the weight of components can be reduced by up to 50% relative to conventional titanium alloys. Fibers with high strength and a high modulus of elasticity are used as reinforcements.

It is already possible to produce weight-reduced components with good strength characteristics with the MMC materials known from the prior art. The MMC materials known from the prior art, however, have the disadvantage, that they do not have a sufficient strength especially with respect to transverse loads or more generally under torsional loads, in order to take-up or brace, with sufficient security, the high loads arising in gas turbines. Previously, no MMC materials, especially no MMC materials based on titanium or a titanium alloy, have been known from the prior art, which have a sufficient strength with respect to transverse loads or torsional loads.

SUMMARY OF THE INVENTION

Beginning from this starting point, the problem underlying the present invention is to provide a novel semifinished product of composite material and a method for the production of the semifinished product.

This problem is solved by a semifinished product according to the invention, wherein ceramic particles are encased or embedded in the metallic matrix material for increasing the strength of the semifinished product with respect to torsional loading or transverse loading.

With the present invention it is proposed for the first time, to encase or embed ceramic particles, which preferably comprise a size in the micron range to the nanometer range, into the metallic matrix material of titanium or a titanium based alloy, for increasing the strength of an MMC semifinished product with respect to torsional loading or transverse loading. With such semifinished products of composite material, it is possible to produce components, even for gas turbines, with a sufficient strength with respect to this group or collective of loading. A preferred utilization is the production of shafts for aircraft engines from the inventive semifinished product.

The invention further provides a method of producing a semifinished product of composite material, in which high tensile strength fibers coated with titanium or a titanium based alloy are consolidated under pressure at high temperature to form the semifinished product. In connection with the coating of the high tensile strength fibers with titanium or the titanium based alloy, ceramic particles are embedded in the coating of the fibers, and the thusly coated fibers are arranged in a desired geometry and consolidated to form the semifinished product.

BRIEF DESCRIPTION OF THE DRAWINGS

An example embodiment of the invention is described in further detail, without being limited to this, in connection with the drawing. Therein, it is shown by.

DETAILED DESCRIPTION OF EXAMPLE EMBODIMENTS OF THE INVENTION

Figure 1:
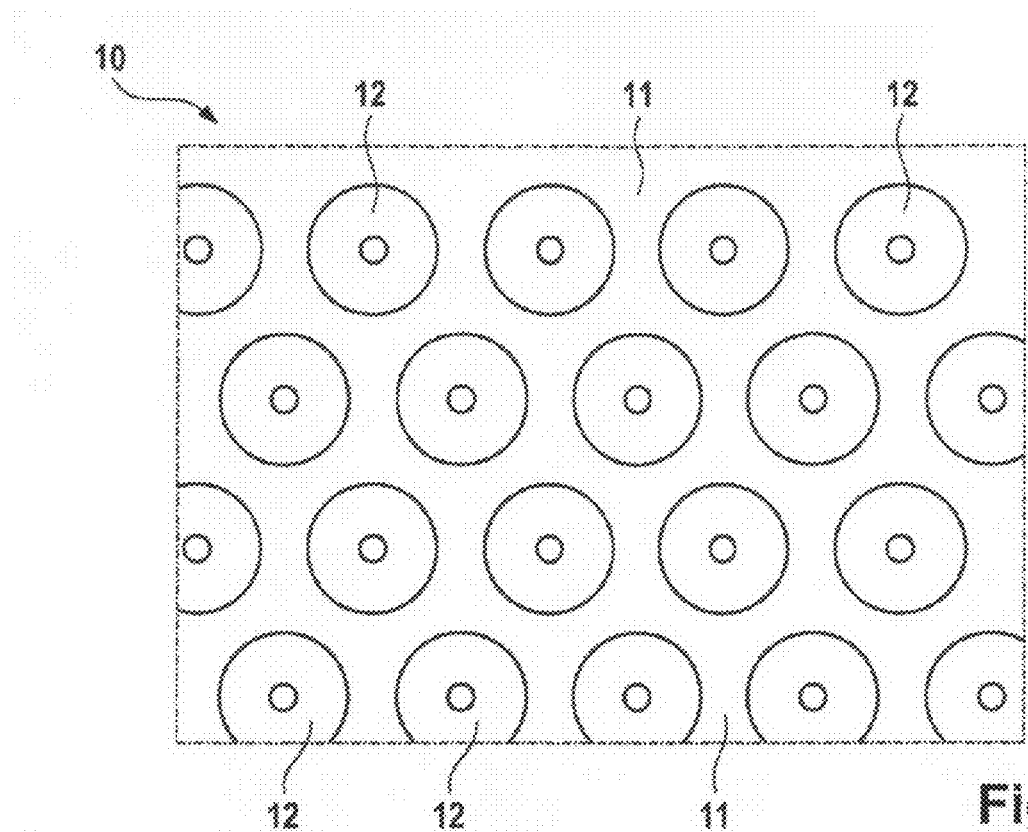
FIG. 1 a schematic cross-section through a semifinished product according to the invention.

FIG. 1 shows a schematic cut-out portion of an inventive semifinished product 10, whereby the semifinished product 10 is formed of a metallic matrix material 11 and tensile-strong or high tensile strength fibers 12 embedded in the matrix material 11. As can be seen from FIG. 1, the fibers 12 are positioned with a high geometric degree of order within the matrix material 11.

The metallic matrix material 11 involves titanium or a titanium based alloy. Silicon carbide fibers (SiC fibers) preferably are utilized as the high tensile strength fibers. However, other fibers can be used as reinforcement fibers, whereby the reinforcement fibers essentially comprise the elements silicon, carbon, boron, oxygen, aluminum and/or nitrogen.

Figure 2:
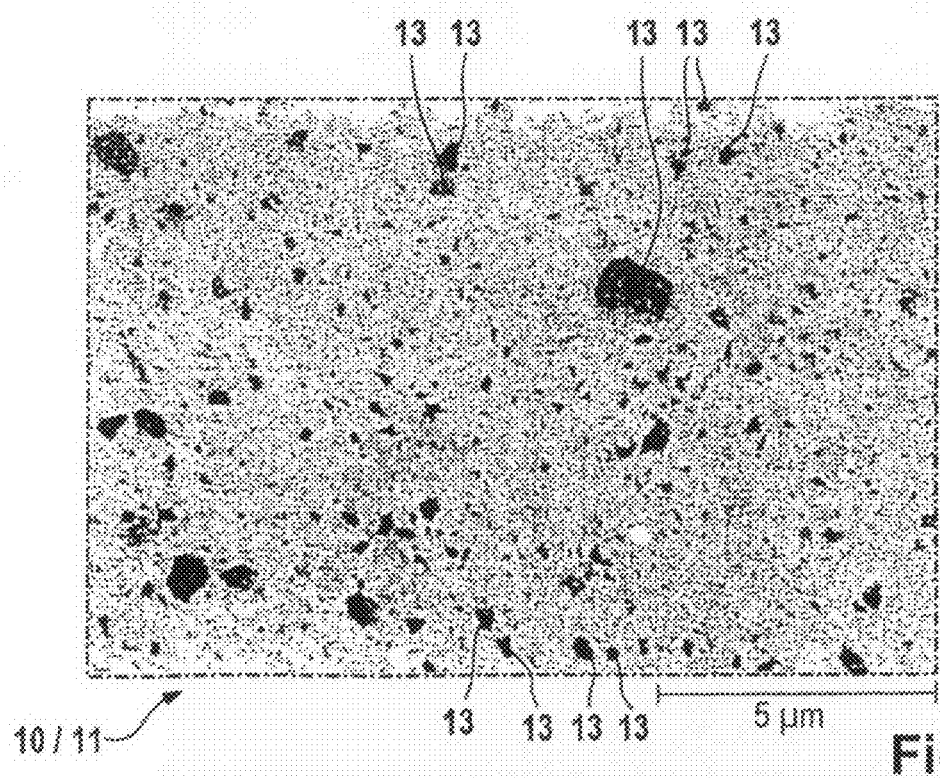
FIG. 2 an enlarged detail of the semifinished product in the area of the carrier material.

In the sense of the present invention, in order to elevate or increase the strength of the semifinished product 10 with respect to torsional loading or transverse loading, ceramic particles 13 are encased or embedded in the metallic matrix material of titanium or the titanium based alloy. FIG. 2 shows an enlarged detail out of the matrix material 11 of the semifinished product 10, whereby the dark particles involve the embedded ceramic particles 13 and the light particles involve the material of the matrix, namely titanium or a titanium based alloy. From the measurement scale shown in FIG. 2, it can be seen that the ceramic particles 13 embedded in the matrix material 11 have a size in the micron range to the nanometer range. The ceramic particles 13 are uniformly distributed in the matrix material 11. The ceramic particles 13 are preferably formed of titanium nitride.

Thus, the inventive semifinished product 10 is formed of a metallic matrix material of titanium or a titanium based alloy, whereby on the one hand silicon carbide fibers are embedded in the matrix material of titanium or the titanium based alloy, and whereby on the other hand ceramic particles 13 of titanium nitrite are embedded in the matrix material 11. With the assistance of the embedded ceramic particles, an increase of the strength of the inventive semifinished product 10 with respect to torsional loading or transverse loading can be realized. The finely dispersed distribution of the nanometer sized or micron sized ceramic particles 13 in the matrix material 11 namely leads to a blocking of the shear bands arising in the metallic matrix under torsional loading or transverse loading, which results in an increase of the strength of the semifinished product 10. Furthermore, a crack propagation in the matrix material 11 is made more difficult, and thereby an operating service life increase is made possible. The inventive semifinished product 10 thereby has overall improved strength characteristics relative to semifinished products known from the prior art.

For the production of the inventive semifinished product, one proceeds as described in the following:

In a first step, the high tensile strength fibers that are to be coated, namely preferably silicon carbide fibers, are prepared. Thereafter, the prepared silicon carbide fibers are coated with the matrix material, i.e. with titanium or a titanium based alloy. The coating of the silicon carbide fibers with titanium or a titanium based alloy proceeds in the sense of the present invention preferably through the use of a PVD (Physical Vapor Deposition) process. Especially the so-called sputtering process, which is also referred to as cathode sputtering, evaporation or atomization, is especially used as the PVD method. In sputtering, a target of the coating material, here of the matrix material, is mechanically sputtered or atomized, and the thus sputtered or atomized matrix material is deposited on the silicon carbide fiber that is to be coated. Details of such PVD methods are well known to the skilled worker in the art addressed here.

In the sense of the present invention, the silicon carbide fibers are not only coated with the matrix material of titanium or the titanium based alloy, but rather, during the coating of the high tensile strength fibers with titanium or with the titanium based alloy, ceramic particles are embedded in the coating of the fibers. For this, the PVD coating is carried out under a reactive atmosphere. The PVD coating of the silicon carbide fibers with titanium or the titanium based alloy especially proceeds under a nitrogen atmosphere. As a result of that, the atomic introduction or inclusion of nitrogen atoms into the metallic coating of the fibers takes place simultaneously or at the same time as the deposition of the titanium or the titanium based alloy on the silicon carbide fibers.

The ceramic particles are now either deposited in-situ during the PVD coating through a reaction of the nitrogen atoms with the metallic alloy components in the gas phase, or are deposited subsequent to the PVD coating through a following thermomechanical treatment. In the deposition, the nitrogen atoms react with the titanium or the titanium based alloy to form ceramic titanium nitride, which finally produces the embedded ceramic particles.

The high cooling rates that arise during the PVD coating process allow an adjustment of the particle sizes for the embedded ceramic particles in the micron range to the nanometer range. The same holds true when the deposition of the ceramic particles proceeds through a following thermomechanical treatment.

Figure 3:
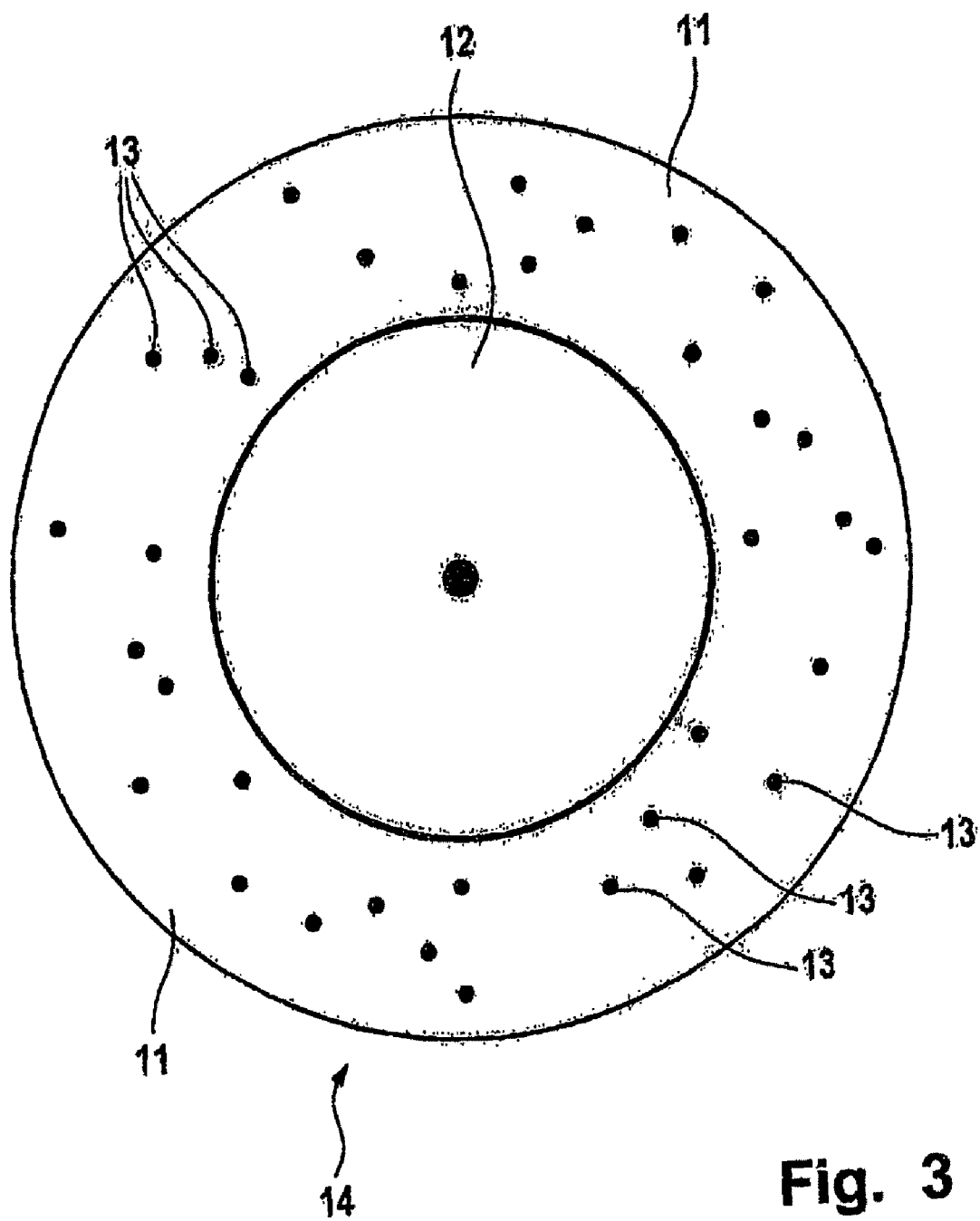
FIG. 3 a coated fiber for the production of the semifinished product according to the invention.

Accordingly, after the above coating of the fibers, the result is silicon carbide fibers coated with titanium or a titanium based alloy, whereby the ceramic particles are encased or embedded in the coating of the fibers. FIG. 3 shows a fiber 14 coated in that manner with titanium or a titanium based alloy, whereby the actual fiber is identified with the reference number 12, the coating of the fiber 12 with titanium or the titanium based alloy is identified with the reference number 11, and the ceramic particles encased or embedded in the titanium or the titanium based alloy are identified with the reference number 13.

For the production of the inventive semifinished product 10, a plurality of fibers 14 coated in that manner are arranged in the desired geometry, and are compressed or consolidated under the influence of pressure at high temperatures to form the actual semifinished product, as is typical in the production of semifinished products from MMC composite material.

The core concept of the present invention, as already explained above, thus relates to the encasing or embedding of ceramic particles 13 in the matrix material of titanium or a titanium based alloy. Thereby, improved strength characteristics of the composite material or of semifinished products of composite material, especially with respect to transverse loads or torsional loads, can be achieved.

The invention claimed is:

1. Method for the production of a semifinished product of composite material, comprising a coating step in which high tensile strength fibers are coated with titanium or a titanium based alloy to form a coating on the fibers in a reactive atmosphere containing a reactive gas, a thermomechanical treatment step performed on the coated fibers after the coating step, and a consolidating step in which the coated fibers are then consolidated under pressure at high temperature to form the semifinished product characterized in that during the coating step atoms of the reactive gas are introduced into the titanium or the titanium based alloy, and then during the thermomechanical treatment step after the coating step the introduced atoms of the reactive gas react with the titanium or the titanium based alloy to form ceramic particles embedded in the coating of the fibers, and then during the consolidating step the thusly coated fibers are arranged in a desired geometry and consolidated to form the semifinished product.

2. Method according to claim 1, characterized in that the reactive atmosphere is a nitrogen atmosphere, whereby nitrogen atoms react with titanium particles or particles of the titanium based alloy to form and deposit the ceramic particles into the coating.

3. Method according to claim 2, characterized in that the ceramic particles comprise particles of titanium nitrides that are deposited into the coating.

4. Method according to claim 1, characterized in that the coating step is carried out as PVD coating.

5. Method according to claim 4, wherein the PVD coating comprises sputtering.

6. A method of making a product of a composite material, comprising the steps:
 a) providing fibers;
 b) coating said fibers with a coat of a titanium-based matrix material containing titanium to produce coated fibers, by carrying out a matrix material deposition process in an atmosphere containing a reactive gas, such that first atoms of said reactive gas are introduced from said atmosphere into said coat of said titanium-based matrix material during said deposition process;

c) after said step b), performing a thermomechanical treatment of said coated fibers, and during said thermomechanical treatment reacting said first atoms of said reactive gas in said coat with second atoms of said titanium-based matrix material in said coat to form ceramic particles comprising said first and second atoms embedded in said coat; and d) arranging and then consolidating said coated fibers in a specified geometry to form thereof said product of said composite material comprising said fibers and said ceramic particles in a matrix comprising said titanium-based matrix material.

7. The method according to claim 6, wherein said fibers are high tensile strength fibers.

8. The method according to claim 6, wherein said fibers are fibers containing a combination of elements selected from the group consisting of Si, B, Al, C, O, and N.

9. The method according to claim 6, wherein said fibers are fibers of SiC.

10. The method according to claim 6, wherein said titanium-based matrix material is titanium or a titanium-based alloy.

11. The method according to claim 10, wherein said reactive gas is nitrogen gas, said first atoms are nitrogen atoms, said second atoms are titanium atoms, and said ceramic particles are titanium nitride ceramic particles.

12. The method according to claim 6, wherein said reactive gas is nitrogen gas, said first atoms are nitrogen atoms, and said ceramic particles are nitride-based ceramic particles.

13. The method according to claim 6, wherein said ceramic particles have a particle size in a size range from nanometers to microns.

14. The method according to claim 13, wherein said size range is below 5 μm.

15. The method according to claim 13, further comprising cooling said coat during said step c), and adjusting said particle size by adjusting a cooling rate of said cooling during said step c).

16. The method according to claim 6, wherein said matrix material deposition process comprises a physical vapor deposition process.

* * * * *